US006310850B1

(12) United States Patent
Sochava et al.

(10) Patent No.: US 6,310,850 B1
(45) Date of Patent: Oct. 30, 2001

(54) METHOD AND APPARATUS FOR OPTICAL DATA STORAGE AND/OR RETRIEVAL BY SELECTIVE ALTERATION OF A HOLOGRAPHIC STORAGE MEDIUM

(75) Inventors: Sergei Sochava, Sunnyvale; Sergei Orlov, Mountain View; Tokuyuki Honda, Menlo Park; Brian H. Cumpston, Sunnyvale; Lambertus Hesselink, Atherton, all of CA (US)

(73) Assignee: Siros Technologies, Inc., San Jose, CA (US)

( * ) Notice: Subject to any disclaimer, the term of this patent is extended or adjusted under 35 U.S.C. 154(b) by 0 days.

(21) Appl. No.: 09/364,323

(22) Filed: Jul. 29, 1999

(51) Int. Cl.$^7$ .................................................. G11B 7/00
(52) U.S. Cl. .......................................................... 369/103
(58) Field of Search .................................. 369/103, 109, 369/275.1; 359/1, 3, 15, 22–25; 430/1, 2, 270.11, 290

(56) References Cited

U.S. PATENT DOCUMENTS

| 3,618,049 | 11/1971 | Amodei et al. ........................ 340/173 |
| 3,632,869 | 1/1972 | Bartollini et al. ..................... 178/6.8 |

(List continued on next page.)

FOREIGN PATENT DOCUMENTS

| 42 08 328 A 1 | 9/1993 | (DE) ................................. G11B/7/00 |
| 195 34 501 A1 | 5/1996 | (DE) ................................. G11B/7/007 |
| 403068949A | 3/1991 | (JP) . |
| 07005796A | 1/1995 | (JP) . |
| 410102766A | 5/1998 | (JP) ................................. C08G/59/68 |
| WO 97/13183 | 4/1997 | (WO) ................................. G03F/7/00 |
| WO 97/44714 | 11/1997 | (WO) ................................. G03H/1/02 |
| WO 99/26112 | 5/1999 | (WO) ................................. G03F/7/00 |
| WO 99/39248 | 8/1999 | (WO) ................................. G03H/1/12 |

OTHER PUBLICATIONS

Fleisher et al., "An Optically Accessed Memory Using the Lippmann Process for Information Storage, " *Optical and Electro–Optical Information Processing*, 1965, Chapter 1, MIT Press, pp. 11–40.

Serdyuk et al., "Structure of Wave Fields Formed by 3–D Vector Holograms, " *Opt. Spectrosc (USSR)*.vol. 57, No. 4, Oct. 1984, pp. 415–419.

(List continued on next page.)

*Primary Examiner*—Thang V. Tran
(74) *Attorney, Agent, or Firm*—Sierra Patent Group, Ltd.; Andrew V. Smith

(57) ABSTRACT

An apparatus and method for optical data storage and/or retrieval using an optical data storage medium having a spatially-modulated refractive index that can be altered locally with optical methods. Data can be written at a plurality of depths throughout the volume of the medium using a write beam and relatively simple and inexpensive optical components. The write beam stores data locally by physical distortion of the medium at discrete storage locations. The alterations can be detected as variations in the reflectivity of the storage locations using a retrieval beam.

34 Claims, 13 Drawing Sheets

U.S. PATENT DOCUMENTS

| | | | |
|---|---|---|---|
| 3,635,545 | 1/1972 | van Kerkhove et al. | 350/163 |
| 3,704,929 | 12/1972 | Sakaguchi et al. | 350/3.5 |
| 3,720,921 | 3/1973 | Schools et al. | 340/13 |
| 3,860,950 | 1/1975 | Wick et al. | 358/2 |
| 3,903,360 | 9/1975 | Kamisaka et al. | 178/6.7 A |
| 3,947,640 | 3/1976 | Ruell et al. | 179/100.3 B |
| 4,024,513 | 5/1977 | Huignard et al. | 340/173 |
| 4,045,115 | 8/1977 | Lee | 350/3.5 |
| 4,058,401 | 11/1977 | Crivello | 96/115 R |
| 4,138,189 | 2/1979 | Huignard et al. | 350/3.64 |
| 4,183,094 | 1/1980 | Keezer et al. | 365/127 |
| 4,187,111 | 2/1980 | Chandross et al. | 430/2 |
| 4,318,581 | 3/1982 | Guest et al. | 350/3.74 |
| 4,458,345 | 7/1984 | Bjorklund et al. | 369/103 |
| 4,467,462 | 8/1984 | Shibata | 369/45 |
| 4,775,968 | 10/1988 | Ohsato | 369/46 |
| 4,859,548 | 8/1989 | Heise et al. | 430/1 |
| 4,920,220 | 4/1990 | Phaff | 544/90 |
| 4,924,455 | 5/1990 | Fujiie et al. | 369/44.21 |
| 4,999,234 | 3/1991 | Cowan | 428/156 |
| 5,157,555 | 10/1992 | Reno | 359/823 |
| 5,161,039 | 11/1992 | Schellenberg | 359/3 |
| 5,191,574 | 3/1993 | Henshaw et al. | 369/100 |
| 5,202,875 | 4/1993 | Rosen et al. | 369/94 |
| 5,242,715 | 9/1993 | Schoen et al. | 427/369 |
| 5,243,589 | 9/1993 | Stuke et al. | 369/100 |
| 5,263,011 | 11/1993 | Maeda et al. | 369/44.27 |
| 5,283,777 | 2/1994 | Tanno et al. | 369/108 |
| 5,289,407 | 2/1994 | Strickler et al. | 365/106 |
| 5,331,445 | 7/1994 | Dickson et al. | 359/15 |
| 5,361,238 | 11/1994 | Owechko | 365/234 |
| 5,408,453 | 4/1995 | Holtslag et al. | 369/44.23 |
| 5,415,835 | 5/1995 | Brueck et al. | 430/311 |
| 5,422,873 | 6/1995 | Kewitsch et al. | 369/103 |
| 5,430,701 | 7/1995 | Ito et al. | 369/44.41 |
| 5,440,669 | 8/1995 | Rakulijic et al. | 359/7 |
| 5,450,218 | 9/1995 | Heanue et al. | 359/21 |
| 5,453,340 | 9/1995 | Kawabata et al. | 430/2 |
| 5,477,347 * | 12/1995 | Redfield | 369/103 |
| 5,479,394 | 12/1995 | Yashima et al. | 369/275.1 |
| 5,499,231 | 3/1996 | Fenneman et al. | 369/124 |
| 5,513,158 | 4/1996 | Ohsato | 369/44.23 |
| 5,526,336 | 6/1996 | Park et al. | 369/94 |
| 5,529,861 * | 6/1996 | Redfield | 430/1 |
| 5,559,773 | 9/1996 | Kentatsu et al. | 369/44.42 |
| 5,566,387 | 10/1996 | Dewald | 369/103 |
| 5,590,110 | 12/1996 | Sato | 369/100 |
| 5,610,895 | 3/1997 | Izumi et al. | 369/112 |
| 5,627,814 | 5/1997 | Lee | 369/116 |
| 5,636,190 | 6/1997 | Choi | 369/44.23 |
| 5,639,579 | 6/1997 | Hayashi et al. | 430/7 |
| 5,659,536 | 8/1997 | Maillot et al. | 369/275.1 |
| 5,671,207 | 9/1997 | Park | 369/112 |
| 5,682,372 | 10/1997 | Yamakawa et al. | 369/94 |
| 5,691,971 | 11/1997 | Kim | 369/112 |
| 5,696,743 | 12/1997 | Kawasaki et al. | 369/32 |
| 5,698,345 | 12/1997 | Ohe et al. | 430/2 |
| 5,701,288 | 12/1997 | Seong | 369/112 |
| 5,702,846 | 12/1997 | Sato et al. | 430/2 |
| 5,712,730 | 1/1998 | Zarschitzky et al. | 359/569 |
| 5,729,522 | 3/1998 | Akama et al. | 369/112 |
| 5,737,294 | 4/1998 | Yamakawa et al. | 369/99 |
| 5,737,295 | 4/1998 | Lee | 369/103 |
| 5,740,136 | 4/1998 | Tsutsui et al. | 369/44.25 |
| 5,748,597 | 5/1998 | Kim | 369/94 |
| 5,754,512 | 5/1998 | Komma et al. | 369/112 |
| 5,757,744 | 5/1998 | Akkermans | 369/44.25 |
| 5,759,721 | 6/1998 | Dhal et al. | 430/1 |
| 5,761,111 | 6/1998 | Glezer | 365/106 |
| 5,764,606 | 6/1998 | Fukumoto et al. | 369/44.41 |
| 5,768,242 | 6/1998 | Juday | 369/103 |
| 5,776,634 | 7/1998 | Ohkuma et al. | 430/2 |
| 5,786,117 | 7/1998 | Hoshi et al. | 430/21 |
| 5,790,493 | 8/1998 | Takeya et al. | 369/58 |
| 5,793,720 | 8/1998 | Nishikata | 369/44.25 |
| 5,793,721 | 8/1998 | Akkermans | 369/44.27 |
| 5,811,789 | 9/1998 | Nix | 250/201.2 |
| 5,822,090 | 10/1998 | Wilde | 359/7 |
| 5,966,361 | 10/1999 | Stoll | 369/103 |
| 5,982,513 | 11/1999 | Zhou et al. | 359/22 |
| 6,020,985 * | 2/2000 | McLeod et al. | 369/109 |
| 6,045,888 | 4/2000 | Chen et al. | 428/64.1 |
| 6,111,828 * | 8/2000 | McLeod et al. | 369/44.23 |

OTHER PUBLICATIONS

Parthenopoulos et al., "Three–Dimensional Optical Storage Memory," *Science*, Aug. 25, 1989, vol. 245, pp. 843–845.

Kawata et al., "Photopolymer System and its Application to a Color Hologram," *Applied Optics*, vol. 33 No. 11, 99. 2152–2156, Reprinted: *Optical Society of America*, 1994, pp. 147–151.

Perry et al., "Enhanced Reverse Saturable Absorption and Optical Limiting In Heavy–Atom Substituted Phthalocyanines," a reprint from *Optics Letters, Jet Propulsion Laboratory, California Institute of Technology,*May 1, 1994, vol. 19, pp. 625–627.

Homan et al., "High–Capacity Optical Storage Using Multiple Wavelengths, Multiple Layers and Volume Holograms," *Electronic Letters*, Apr. 13, 1995, bol. 31, No. 8, pp. 621–623.

Kawata et al., "Three–Dimensional Optical Memory with a Photorefractive Crystal,"*Applied Optics*, Jul. 10, 1995, vol. 34, No. 20, pp. 4105–4110.

Kardinahl et al., "Photoinduced Refractive–Index Changes in Fulgide–Doped PMMA Films," *Applied Physics A: Materials Science and Processing,* 1995, vol. 61, No. 1, pp. 23–27.

Lessard et al., "Selected Papers on Photopolymers, "*SPIE*, 1995, vol. MS 114.

Waldman et al., "Cationic Ring–Opening Photopolymerization Methods for Volume Hologram Recording, "*SPIE*, 1996, vol. 2689, No. 26, pp. 127–141.

Kawata et al., "Randomly Accessible, Multilayered Optical Memory with as Bi 12 SiO 20 Crystal, " *Applied Optics*, Sep. 10, 1996, vol. 35, No. 26, pp. 5308–5311.

Perry et al., "Organic Optical Limiter with a Strong Non-linear Absorptive Response, " *Science*, Sep. 13, 1996, vol. 273, pp. 1533–1536, a reprint series from: *1996 by the American Association for the Advancement of Science*.

Glezer et al., "Three–Dimensional Optical Storage Inside Transparent Materials, " *Optics Letters*, Dec. 15, 1996, vol. 21, No. 24, pp. 2023–2025.

Waldman et al., "Determination of Low Transverse Shrinkage in Slant Fringe Gratings of a Cationic Ring–Opening Volume Hologram Recording Material, "*SPIE*, 1997, vol. 3010, pp. 354–372.*

Nalwa et al., "Nonlinear Optics of Organic Molecules and Polymers, "*CRC Press, Inc.*,1997, pp. 813–840.*

Eichler et al., "High Density Disc Storage by Multiplexed Microholograms, " *SPIE —The International Society for Optical Engineering*, Apr. 7–9, 1997, vol. 3109, pp.239–244.*

Diez et al., "High Density Disc Storage by Multiplexed Microholograms, " *Cleo 97*, 1997, pp. 258–259.*

Elrich et al., "Two–Photon Absorption and Broadland Optical Limiting with Bis–Donor Stilbenes, "*Optics Letters*, Dec. 15, 1997, vol. 22, No. 24, pp. 1843–1845.*

Waldman et al., "Holographic Recording Properties in Thick Films of ULSH–500 Photopolymer, "*SPIE*, 1998, vol. 3291, pp. 89–103.*

Eichler et al., "Multiplexed Holograms for the Microholographic Storage Disc," *Technical Digest*, May 10–13, 1998, vol. 8, pp. 77–79.*

Khairutdinov et al., "Photochromism of Spirooxazines in Homogeneous Solution and Phospholipid Liposomes, " *Journal of the American Chemical Society*, Dec. 16, 1998, vol. 120, No. 49. pp. 12707–12713.*

Eichler et al., "Holographic Recording of Microscopic Bragg–Reflectors for Optical Storage , "*SPIE*, 1998, vol. 3401, pp. 118–127.*

Cumpston et al., "Two–Photon Polymerization Initiators for Three–Dimensional Optical Data Storage and Microfabrication, " *Nature*, Mar. 1999. pp. 51–54.*

Loy et al., "Cyclization Phenomena in the Sol–Gel Polymerizaton of a, w–Bis (triethoxysily Alkanes and Incorporation of the Cyclic Structures into Network Silsesquioxane Polymers, "*Journal of the American Chemistry Society*, 1999, vol. 121, pp. 5413–5425.*

H.J. Eichler, "Wavelength Multiplexing for the Microholographic Storage Disc, "*SPIE*, 1998, vol. 3401, pp. 177–186.*

Albota et al., "Design of Organic Molecules with Large Two–Photon Absorption Cross Sections, " *Science*, Sep. 11, 1998, vol. 281. pp. 1653–1656.*

J. Eickmans et al., "Photoaddressable Polymers: A New Class of Materials for Optical Data Storage and Holographic Memories, "1999, pp. 184–185.*

* cited by examiner

METHOD AND APPARATUS FOR OPTICAL DATA STORAGE AND/OR RETRIEVAL BY SELECTIVE ALTERATION OF A HOLOGRAPHIC STORAGE MEDIUM

RELATED APPLICATION DATA

This application is related to the U.S. patent application Ser. No. 09/016,382 filed Jan. 30, 1998, and entitled "Optical Data Storage by Selective Localized Alteration of a Format Hologram," by inventors Lambertus Hesselink, Robert R. McLeod, Sergei L. Sochava, and William Phillips, which is assigned to the assignee of the present invention.

BACKGROUND OF THE INVENTION

1. Field of the Invention

The present invention relates to the storage and retrieval of digital data using, an optical medium. More specifically, the present invention relates to a novel optical storage device using a bulk optical recording medium having a spatially-modulated refractive index with data stored thereon as localized alterations in the medium.

2. Background

Optical data storage technology has tended to follow two complementary lines of development. In one approach, data is encoded as minute variations in the surface of a recording medium, such as a compact disc, or CD. The data are readable using optical means (usually a laser), similar to the way in which data recorded in a magnetic medium are readable with a magnetically-sensitive head, or data recorded in a vinyl medium are readable with a needle. Unlike vinyl recording, however, in optical storage the data are usually stored digitally. For read-only compact discs, data are stored as microscopic pits on the surface of a substrate. In addition, recordable or re-writable bit-based optical systems are readily available. Examples include magneto-optic systems, in which the orientation of a magnetic domain changes the direction of rotation of the polarization of a reflected, focussed light beam; phase-change systems, in which a medium can be locally crystalline or polycrystalline, each of which states have a variance in reflectivity; and, dye-polymer systems, in which the reflectivity of a medium is changed by the high-power illumination.

Each bit of data has specific physical location in the storage medium. The storage density of optical media is limited by physical constraints on the minimum size of a recording spot. Another basic limitation of conventional optical storage is that data are usually stored on the surface of the medium only. Recording throughout the volume of a storage medium would provide an opportunity to increase capacity.

Multi-layer storage is also possible, but usually requires the manufacture of special, heterogeneous, layered recording media, whose complexity increases quickly with the number of layers needed. Most commercially-available multi-layer optical storage media offer no more than two data layers, and come in a pre-recorded format.

An alternative approach to traditional optical storage is based on holographic techniques. In conventional volume holographic recording, laser light from two beams, a reference beam and a signal beam containing encoded data, meet within the volume of a photosensitive holographic medium. The interference pattern from the superposition of the two beams results in a change or modulation of the refractive index of the holographic medium. This modulation within the medium serves to record both the intensity and phase information from the signal. The recorded intensity and phase data are then retrieved by exposing the storage medium exclusively to the reference beam. The reference beam interacts with the stored holographic data and generates a reconstructed signal beam which is proportional to the initial signal beam used to store the holographic image. For information on conventional volume holographic storage, see, for example, U.S. Pat. Nos. 4,920,220, 5,450,218, and 5,440,669.

Typically, volume holographic storage is accomplished by having data written on the holographic medium in parallel, on 2-dimensional arrays or "pages" containing $1 \times 10^6$ or more bits. Each bit is generally stored as information extending over a large volume of the holographic storage medium, therefore, it is of no consequence to speak in terms of the spatial "location" of a single bit. Multiple pages can then be stored within the volume by angular, wavelength, phase-code or related multiplexing techniques.

Unfortunately, conventional volume holographic storage techniques generally require complex, specialized components such as amplitude and/or phase spatial light modulators. Ensuring that the reference and signal beams are mutually coherent over the entire volume of the recording medium generally requires a light source with a relatively high coherence length, as well as a relatively stable mechanical system. These requirements have, in part, hindered the development of inexpensive, stable, and robust holographic recording devices and media capable of convenient operation in a typical user environment.

In order for volumetric optical data storage to mature into a viable data storage option the process must be developed so that the operation is relatively simple, inexpensive and robust. Foremost in this development is accomplishing multi-depth bit-wise optical data storage and/or retrieval. As data recording proceeds to a greater number of depths within the storage medium it becomes increasingly more critical to isolate the recorded bit within a specific area within the medium. In multi-depth storage and/or retrieval, it is also important to write data at a given depth without affecting data at other depths. Further, for multidepth bit-wise optical data storage and/or retrieval, it is important to have separate write and read conditions, so that readout does not negatively affect recorded data.

BRIEF DESCRIPTION OF THE INVENTION

Briefly, and in general terms, the present invention provides a system and method for storage and/or retrieval of digital data using a bulk optical recording medium having a spatially-modulated refractive index profile that can be altered locally. Data can be written on multiple layers throughout the volume of the bulk recording medium using relatively simple and inexpensive optical methods.

In a presently preferred embodiment of the invention, the bulk, monolithic medium has a periodic, spatially-modulated refractive index that varies along a single depth axis of the medium, defining a plurality of reflective Bragg fringes. The bulk medium can be produced, for example, by recording a format hologram in a photosensitive medium, preferably a photopolymer. The periodic structure of the bulk medium defines a first Bragg reflection condition, so that the medium is relatively reflective to light of specific wavelengths incident upon the material at specific orientations with respect to a format hologram, and relatively transparent to other sources of light at particular wavelength/orientation combinations.

Generally, the format hologram itself does not represent stored data, and can be produced under controlled conditions in a factory environment. Instead, data are written in the bulk medium by focusing a single write beam onto desired storage locations within the volume of the medium. The write beam stores data locally by modification of the medium. In a preferred embodiment of the present invention, in altered locations, a second Bragg reflection condition is established that is distinct from the first Bragg reflection condition of the bulk medium, so that the alterations can be detected as variations in the reflectivity of the storage locations to a retrieval beam of light. The second Bragg condition may be achieved, e.g., by changing the fringe spacing and/or index of refraction at a data storage location. The retrieval beam may be tuned sufficiently close to either the first or second Bragg reflection conditions to allow substantial reflection to distinguish the two Bragg reflection conditions. Data storage and retrieval can be performed using relatively simple and inexpensive optical and mechanical components in a user environment.

A preferred embodiment comprises a periodic spatially-modulated refractive index, but in general, other index profiles are possible, such as chirped profiles.

DETAILED DESCRIPTION OF THE INVENTION

A novel technique for optical data storage involves the recording of a format hologram in a bulk optical medium, and then recording data in the medium by creating localized alterations in the format hologram at selected data storage locations. One approach to this type of optical data storage is described in copending U.S. patent application Ser. No. 09/016,382 filed on Jan. 30, 1998, in the name of inventor Hesselink et al., entitled "Optical Data Storage by Selective Localized Alteration of a Format Hologram and/or retrieval by Selective Alteration of a Holographic Storage Medium" which describes a data storage device comprising a format hologram in which data is store at a plurality of depths therein by selective localized alteration of the format hologram. Light reflected from the focus of an incident beam of light is measured by confocal detection, and is optimally reflected when Bragg-matched to the hologram grating at its beam waist. Selective localized alteration serves to change the reflectivity at the beam focus by locally changing the properties of the hologram. In this manner, data are represented by the changes in reflectivity of the format hologram.

The present invention provides a system and method for storage and/or retrieval of optical digital data using a bulk optical recording medium having a periodic, spatially-modulated refractive index that varies along a single depth axis of the medium, defining a plurality of reflective Bragg fringes. The bulk medium can be produced by recording a format hologram in the volume of a photosensitive medium, preferably a photopolymer. Various types of photopolymers may be used with the invention, and numerous examples of suitable photopolymers are described in detail by R. A. Lessard and G. Manivannan (Ed.) in "Selected Papers on Photopolymers", SPIE Milestone Series, Vol. MS 114, SPIE Engineering Press, Bellingham, Wash. (1995), and in the references noted below. Those of ordinary skill in the art will readily appreciate that other host materials may used in lieu of photopolymers, including glass and crystalline media.

The periodic structure of the format hologram in the bulk medium defines a first Bragg reflection condition, so that the medium is relatively reflective to light of specific wavelengths incident upon the material at specific orientations with respect to a format hologram, and relatively transparent to other sources of light at particular wavelength/orientation combinations. Data is written by a write beam which is focused at selectable data storage locations within the medium, and which results in localized alterations of the format hologram at the selected data storage locations. The localized alterations define a second Bragg reflection condition that is distinct from the first Bragg reflection condition of the medium, which can then be detected as variations in the reflectivity of the data storage locations to a retrieval beam of light.

Figure 1A:
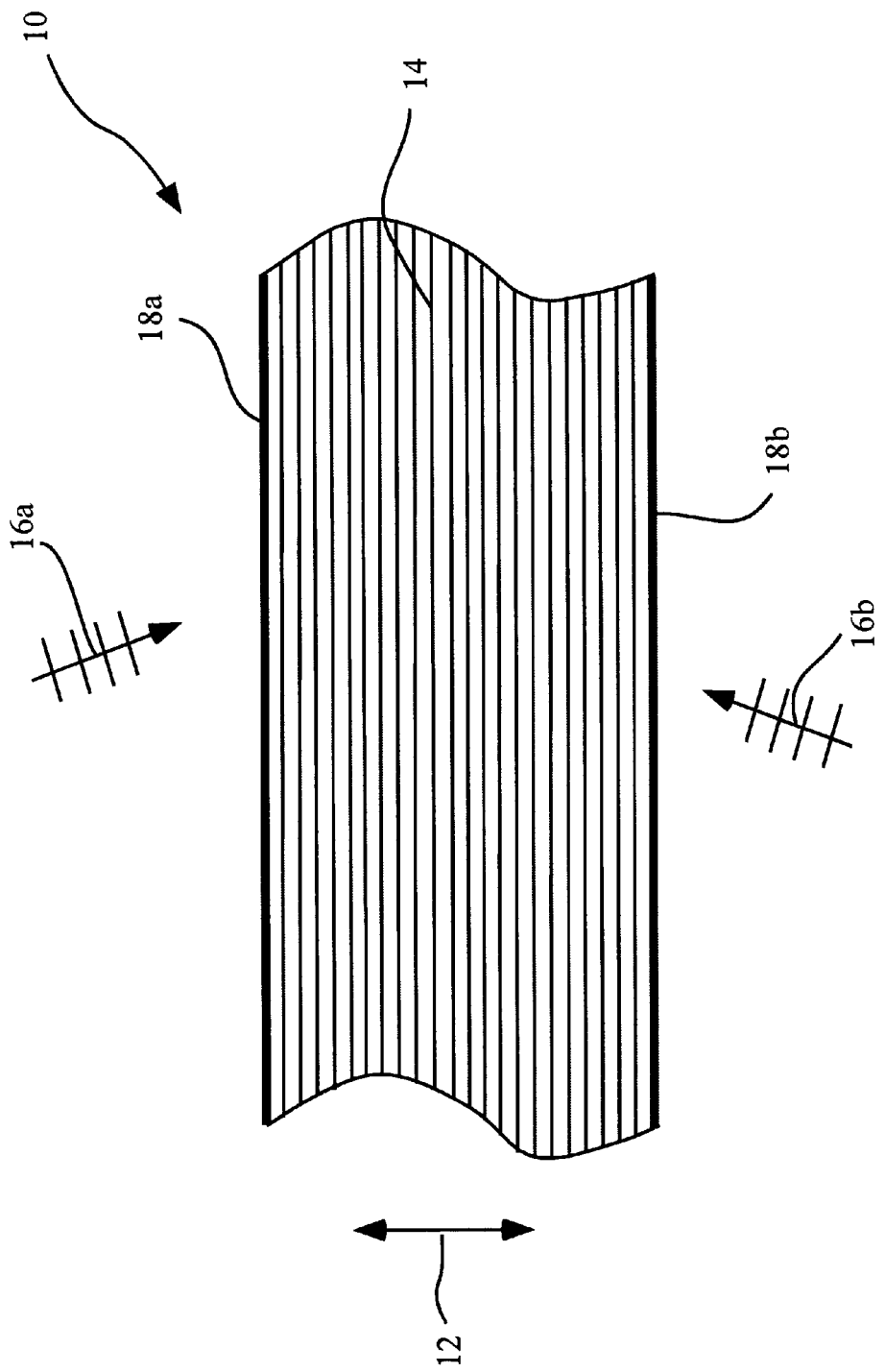
FIG. 1A is a schematic diagram of an elevational cross section of a bulk optical medium and two plane-wave beams used to form interference fringes within the medium.

FIG. 1A is a cross-sectional elevational schematic drawing of a bulk optical recording medium 10 used in a presently preferred embodiment of the invention. The bulk recording medium 10 shown in FIG. 1A has a periodic, spatially-modulated refractive index that varies along a single depth axis 12 of the material, defining a plurality of reflective Bragg fringes 14. Preferably, the bulk medium 10 is typically on the order of magnitude of 100 microns in thickness, for instance, about 100–200 $\mu$m, and the spacing between Bragg fringes 14 is approximately one thousand times smaller, on the typical order of magnitude of 100 nanometers, for instance, about 170 nanometers. The spacings shown in FIG. 1A, therefore, are not drawn to scale.

The periodic structure of the bulk recording medium 10 defines a first Bragg reflection condition, so that the medium 10 is particularly reflective to light of certain frequencies incident upon the medium 10 at specific angles, and is relatively transparent to light from other sources. Specifically, if the spacing between Bragg fringes is d, the index of refraction is n and the light is incident upon the medium 10 at an angle of $\theta$ with wavelength $\lambda$, then the Bragg reflection condition is that the quantity $2nd\sin\theta$ should be equal to $\lambda$: $\lambda = 2nd\sin\theta$, in which $\theta$ is the angle between the direction of propagation of a plane wave and a Bragg fringe within the medium. The Bragg reflection condition defines peak reflection. Generally, it is well known that substantial reflection will occur for a small range of wavelengths at a fixed angle, or a small range of angles at a fixed wavelength. In particular, the Bragg reflection condition depends on the spacing between consecutive fringes. For a reflection grating Bragg-matched for normal incidence, $\theta = \pi/2$, therefore $\lambda = 2nd$. "Optical fringe spacing" is defined as nd.

A presently preferred method for creating the bulk recording medium 10 comprises a holographic recording technique illustrated in FIG. 1A The photosensitive layer or medium 10 can be formed, for example, by depositing a photopolymer between two glass plates. The photopolymer generally includes a polymerizable monomer, and an active binder having a different refractive index than the monomer and resulting polymer. Light-induced polymerization of the monomer results in phase separation of the active binder and monomer/polymer at exposed portions of the medium, which in turns results in refractive index variations within medium 10. The preferred photopolymers for use with the invention are described further below.

The bulk recording medium 10 is formed by exposing a planar, initially homogeneous photosensitive layer of material to two coherent monochromatic light beams 16a and 16b. Beams 16a and 16b can be generated from a single beam of laser light using a beam splitter and optical elements well-known to those of ordinary skill in the art of holography. The beams 16a and 16b are incident upon opposite sides 18a and 18b of the material at slightly oblique angles. An interference pattern of light and dark fringes is established that alters the refractive index in the bulk material in those parts of the layer where beams 16a and 16b constructively interfere. The spacing between these fringes will be on the order of half the wavelength of beams 16a and 16b. Preferably, the hologram is formed in a photopolymer, which is then fixed to render the photopolymer insensitive to further holographic exposure at the wavelength used to record the format hologram. Data are then recorded bit-wise as local alterations of the format hologram at discrete physical locations, using a data writing beam with a wavelength different from that used for recording the format hologram.

Figure 1B:
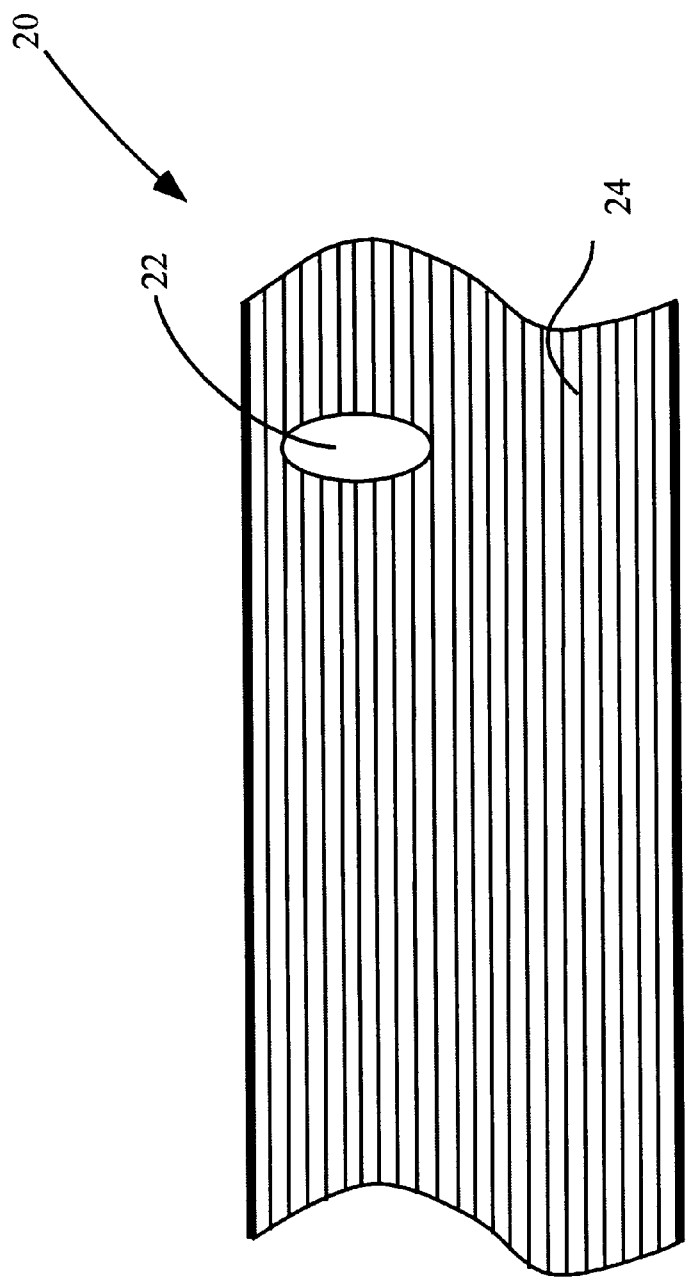
FIG. 1B is a schematic diagram of an elevational cross section of a bulk optical storage medium having a planar format hologram stored therein and a data bit recorded within the hologram.

FIG. 1B illustrates a schematic diagram of a bulk optical storage medium 20 having a recorded data bit 22 stored therein. The recorded data bit 22 is formed by disrupting or altering the format hologram in the bulk optical storage medium 20 where data bit 22 is located within medium 20. Medium 22 will generally include a plurality of additional data bits (not shown) like data bit 22, which are recorded at selected data storage or bit locations throughout medium 20. One method of data encoding according to the present invention is to represent one binary data state by leaving the format hologram unaltered at a bit location, and to represent the other data state by altering the grating fringes of the format hologram at a bit location as is illustrated schematically by region 22.

Figure 1C:
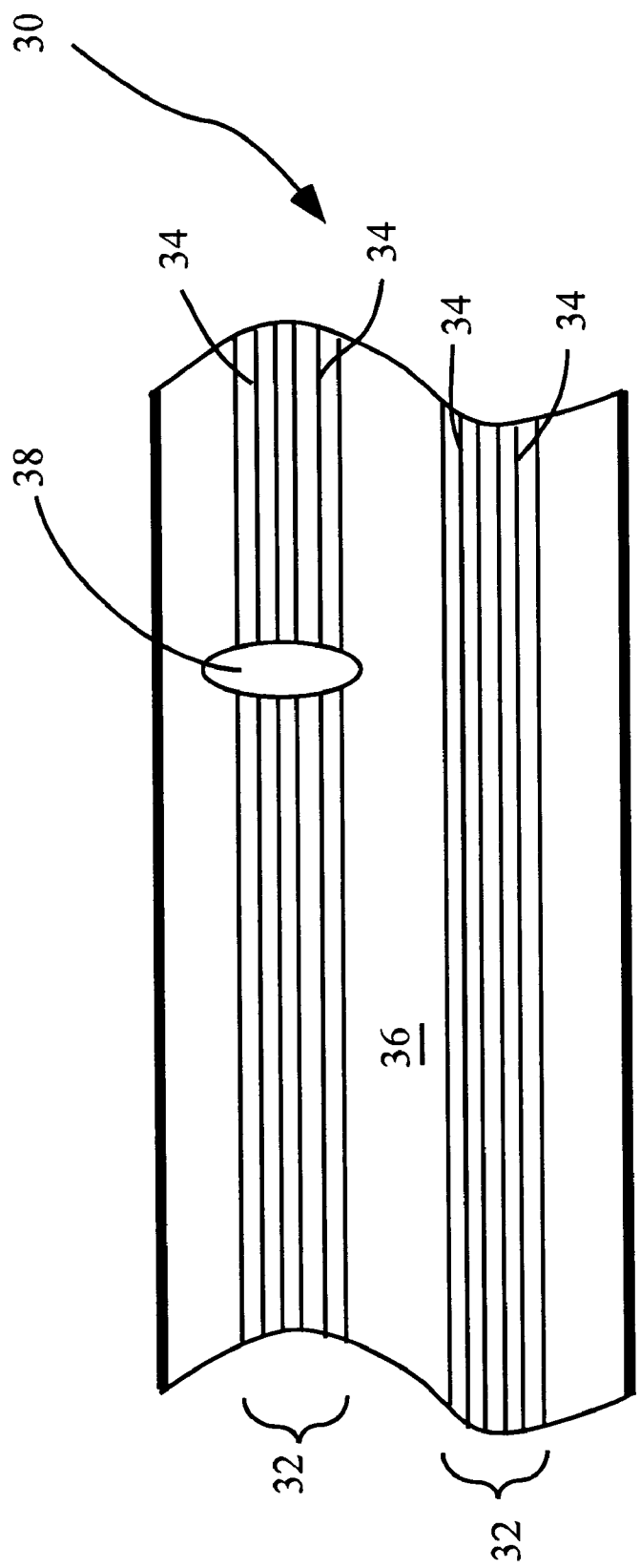
FIG. 1C is a schematic diagram of an elevational cross section of an optical storage medium having a format hologram defining distinct layer storage subvolumes, with a data bit shown recorded within a subvolume.
Figure 1D:
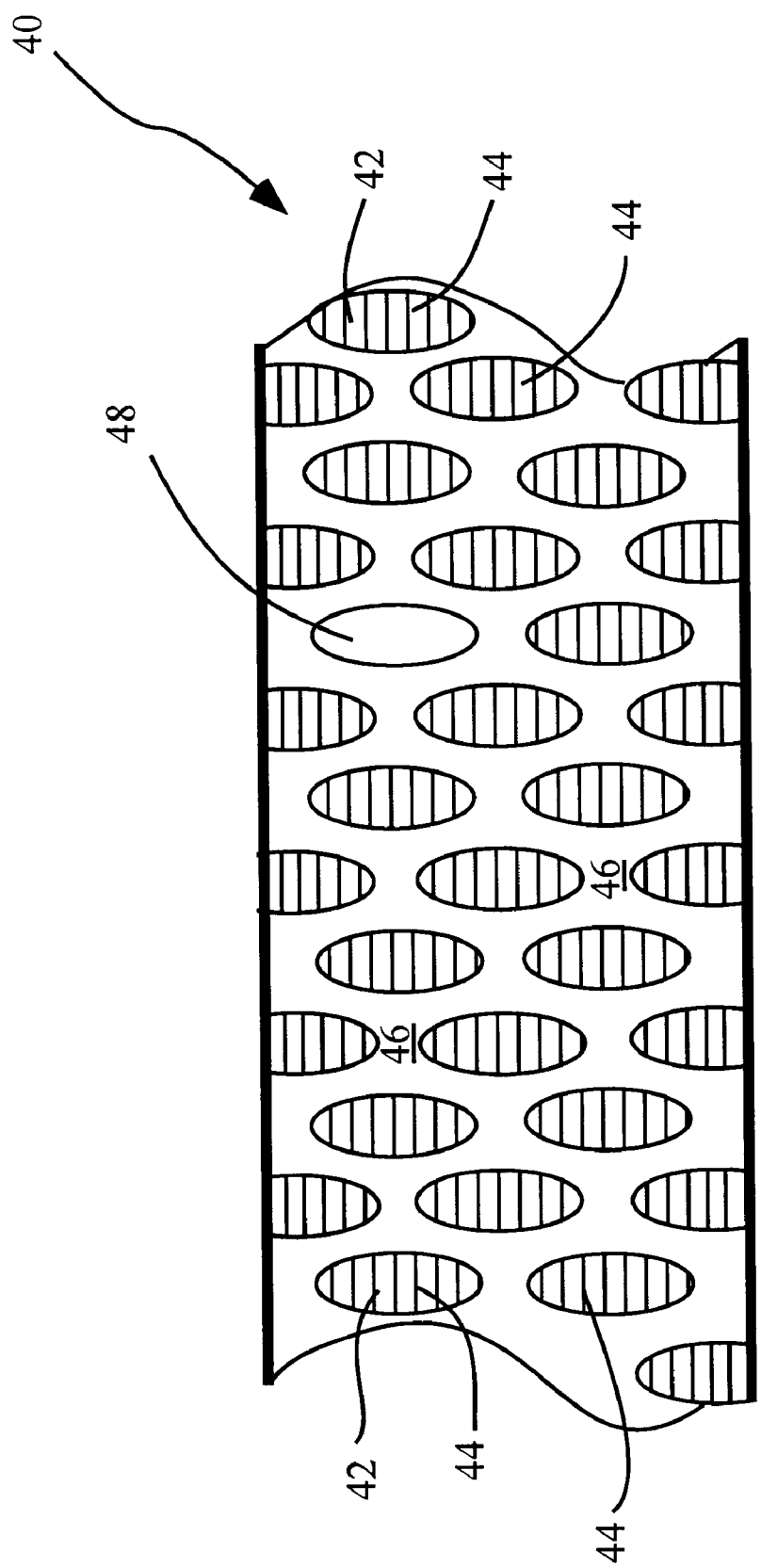
FIG. 1D is a schematic diagram of an elevational cross section of an optical storage medium having a format hologram defining plurality of tube storage subvolumes, with a data bit shown recorded within a subvolume.
Figure 1G:
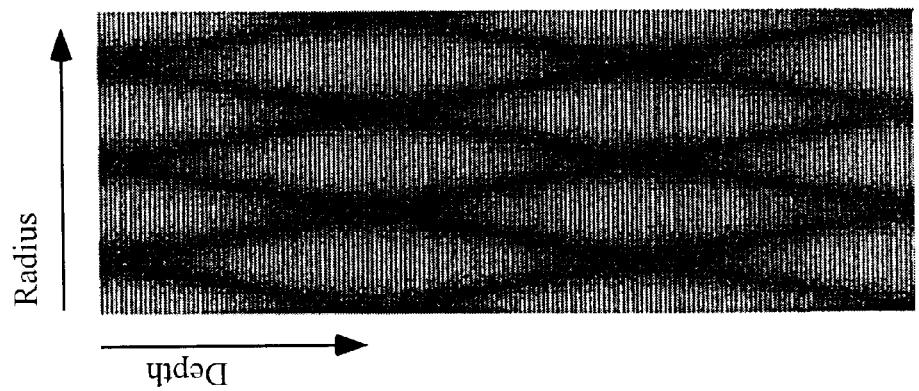
FIGS. 1E, 1F and 1G are cross sectional views of format hologram grating structures showing a simple format hologram, a two constituent hologram and a four constituent hologram, respectively.
Figure 1F:
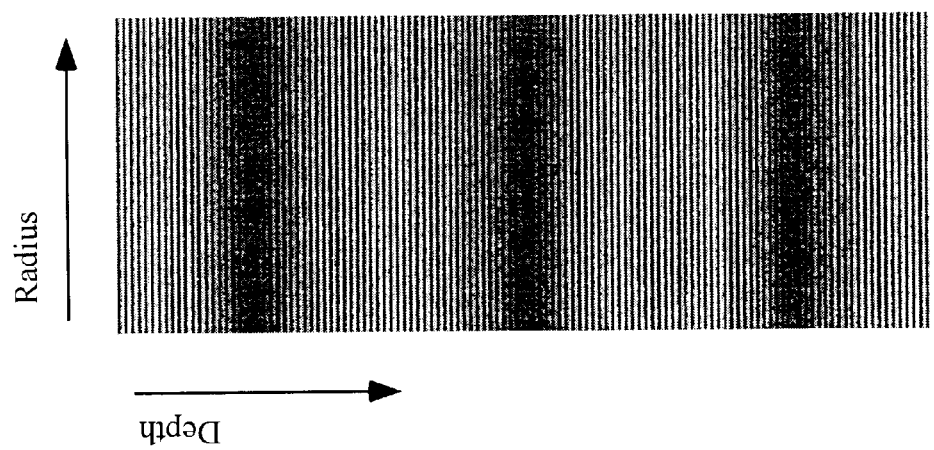

In one embodiment of the present invention, grating fringes are altered by changing the fringe spacing and/or changing the index of refraction. The schematic in FIG. 1B is intended to show a generic alteration of the format hologram at a bit location, which may be a fringe deletion, a local alteration of grating fringes, or other types of alteration. FIG. 1H shows a schematic that illustrates an exaggerated change in fringe spacing according to an embodiment of the present invention.

The format hologram of FIGS. 1A and 1B can be used to store data at multiple layers within the volume of a bulk medium. Layer and/or track definition can be used to predetermine layers and/or tracks for data location and generally a more complex format hologram grating structure than the planar structure shown in FIGS. 1A and 1B. These complex format hologram grating structures can aid in the identification and location of specific layers and/or tracks.

Spatially modulated refractive index profiles with structure can be generated by superimposing more than one distinct hologram grating. FIGS. 1C and 1D are schematic diagrams illustrating cross sectional views of periodic spatially modulated refractive index profiles having more than one distinct hologram grating. The index profile illustrated in FIG. 1C depicts an optical storage medium 30 having a plurality of distinct layer storage subvolumes 32 stacked along the depth of the holographic storage material 30. Each layer storage subvolume 32 is characterized by the presence of reflective fringes 34 of the spatially modulated refractive index profile, while the space 36 between adjacent subvolumes 32 is characterized by relative lack of variation in the index of refraction within the medium 30. Thus, each layer storage subvolume 32 is more reflective than the space 36 between the volumes. The spatial variation of the index of refraction along the depth of the medium 30 is characterized by at least two closely-spaced hologram grating vectors. In this embodiment data are preferably recorded within layer storage subvolumes 32. A data bit 38 is illustrated as a local alteration of the index profile. The spacings between fringes 34 and the space 36 between adjacent subvolumes 32 are by way of example and, therefore, are not depicted to scale.

The spatially modulated refractive index profiles illustrated in FIG. 1D depict a holographic storage medium 40 having a plurality of distinct storage subvolumes 42 arranged in concentric tubes throughout the volume of the bulk storage medium 40. This figure illustrates a cross-sectional view of the depth and radius of the material; in disk media the tubes extend circumferentially into the plane of the cross-section. Each tube storage subvolume 42 is characterized by the presence of reflective fringes 44 of the spatially modulated refractive index profile, while the space 46 between adjacent subvolumes 42 is characterized by relative lack of variation in the index of refraction within the medium 40. Thus, each tube storage subvolume 42 is more reflective than the space 46 between the volumes 42. The spatial variation of the index of refraction is characterized by at least three distinct hologram gratings. In this embodiment data are preferably recorded within tube storage subvolumes 42. A data bit 48 is illustrated as a local alteration of the index profile. The spacings between fringes 44 and the space 46 between adjacent subvolumes 42 are by way of example and, therefore, are not depicted to scale.

Figure 1E:
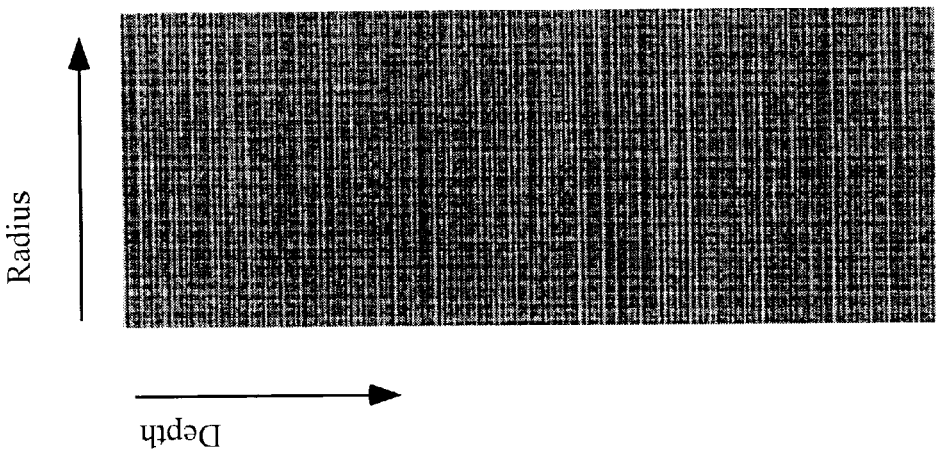
Figure 1H:
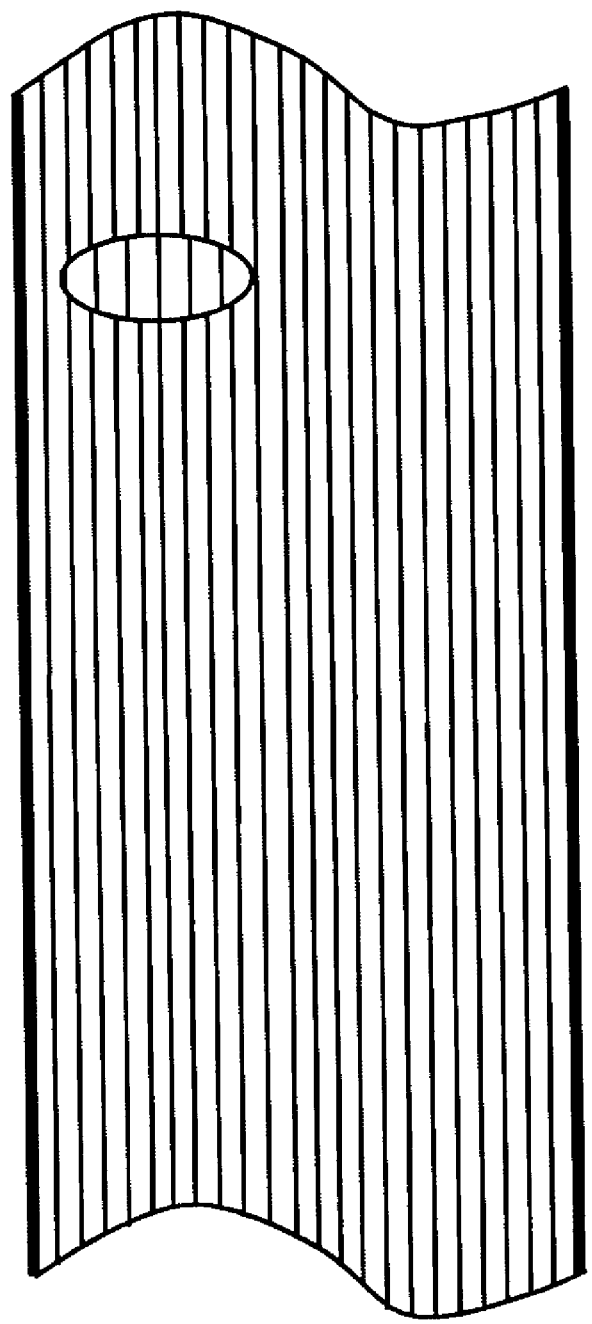
FIG. 1H is a schematic diagram illustrating an exaggerated change in fringe spacing according to an embodiment of the invention.

FIG. 1E shows a simple format hologram as illustrated schematically in FIGS. 1A and 1B. Additionally, FIGS. 1F and 1G show format hologram grating structures having complex structures for layer and track definition. For layer-only definition, FIG. 1F shows a cross sectional view of a format hologram grating structure having two constituent holograms for track and layer definition as illustrated schematically in FIG. 1C. The radius of the format hologram grating structure is represented by the horizontal axis and the depth of the format hologram grating structure is represented by the vertical axis. FIG. 1G shows a format hologram grating structure having four constituent hologram gratings for tube track and layer definition as illustrated schematically in FIG. 1D. These constituent holograms exist throughout the entire volume and locally interfere to produce a reflection hologram grating structure with a spatially varying envelope, as shown in FIGS. 1F and 1G. Methods for generating such format hologram grating structures are omitted from this disclosure in order to avoid overcomplicating the disclosure. For a detailed disclosure of generating two and four constituent format holograms and format hologram grating structures see, for example, U.S. patent application Ser. No. 09/016,382 filed on Jan. 30, 1998, in the name of inventors Hesselink et. al. entitled "Optical Data Storage by Selective Localized Alteration of a Format Hologram" and U.S. patent application Ser. No. 09/229,457 filed on Jan. 12, 1999, in the name of inventors Daiber et. al., entitled "Volumetric Track Definition for Data Storage Media Used to Record Data by Selective Alteration of a Format Hologram".

Local alteration of the format hologram can be achieved by substantial local heating of a photopolymer. Local heating results in local inelastic expansion or contraction. Generally, photopolymers of thicknesses in the range of about 100 to 200 microns that absorb about 50% of incident optical power allow for local inelastic expansion under illumination of lasers operating on the order of several hundred milliwatts and focused with a numerical aperture of about 0.5 or higher, for exposure times in the range of one microsecond to one millisecond. The required optical absorption can be achieved by several different physical processes that include, but are not limited to photochromism and thermochromism.

In one embodiment of the invention, given by way of example and not necessarily by way of limitation, the photosensitive medium is a photopolymer based on cationic ring-opening polymerization using media similar to those described in U.S. Pat. No. 5,759,721, issued Jun. 2, 1998 entitled "Holographic Medium and Process for Use Thereof" by inventors Dhal et.al., "Holographic Recording Properties in Thick Films of ULSH-500 Photopolymer", D. A. Waldman et al., SPIE Vol. 3291, pp.89–103 (1998), in "Determination of Low Transverse Shrinkage in Slant Fringe Grating of a Cationic Ring-Opening Volume Hologram recording Material," Waldman et al., SPIE Vol. 3010, pp. 354372 (1997), "Cationic Ring-Opening Photopolymerization Methods for Volume Hologram Recording, D. A. Waldman et al., SPIE Vol. 2689, pp. 127–141 (1996), "Holographic Medium and Process," by Dhal et al., WO 97/44714 (1997), "Holographic Medium and Process," by Dhal et al., WO 97/13183 (1997), and "Holographic Medium and Process," by Dhal et al., WO 99/26112 (1999). These types of photopolymer media typically comprise about 3 to about 10 percent by weight of photo-acid generator, about 20 to about 60 percent by weight of active binder and from about 40 to about 70 percent by weight cationic ring-opening monomer(s). Other suitable compositions can be readily determined empirically by those of ordinary skill in the art. Additionally, a sensitizer may be added to the photopolymer material to allow format holograms to be recorded at a desired wavelength. Those of ordinary skill in the art will realize that the sensitizer chosen for a specific application will be suitable for the corresponding photopolymer. The sensitizer chosen will generally exhibit absorption at the desired wavelength and, upon excitation, the sensitizer will be capable of transferring an electron to the photo acid generator.

These photopolymer compositions provide a monomer/polymer having a relatively low refractive index and an active binder of relatively high refractive index. Photoinduced polymerization of the monomer induces phase separation of the monomer/polymer and active binder to form low and high refractive index regions to record the hologram. The term "active binder" is used herein to describe a material which plays an active role in the formation of a holographic grating. That is, the holographic recording process imparts a segregation of active binder from monomer and/or polymer. The active binder is appropriately chosen such that it provides a periodic refractive index modulation in the photopolymer. An active binder, in this sense, can be differentiated from the typical use of inert binder materials in photopolymers to impart mechanical properties or processability. The active binder may additionally serve other purposes, such as those of a conventional inert binder.

More specifically, the preferred photopolymer compositions generally comprise one or more photoacid generators, one or more sensitizing dyes, polymerizable CROP monomers, and a high refractive index active binder or binders, which are typically low molecular weight silicones. Specific photoacid generators used in these compositions include 4-octylphenyl(phenyl)iodonium hexacuoroantimonate, bis(methylphenyl)iodonium tetrakis pentafluorophenyl)borate, cyclopentadienyl cumene iron(II) hexafluorophosphate, and/or cumyltoluliodonium tetrakis (pentafluorophenyl) borate. The sensitizer for these photoacid generators is preferably 5,12 bis(phenyl-ethynyl) naphthacene, which sensitizes the photoacid generators to absorption at green wavelengths. Preferably, the monomer is a difunctional cyclohexene oxide monomer such as 1,3-bis [2-(3{7oxabicyclo[4.1.0]heptyl}) ethyl]tetramethyl disiloxane, which is available from Polyset Corp. under the name PC-1000™, and/or a tetrafunctional monomer such as tetrakis[2(3{7-oxabicyclo[4.1.0]heptyl})ethyl (dimethylsilyloxy)silane, which is available from Polyset Corp under the name PC-1004™. The active binder is typically Dow Corning 710™ poly(methylphenylsiloxane) fluid, Dow Corning 705™ 1,3,5-trimethyl-1,1,3,5,5 pentaphenyltrisiloxane, and/or a like silicone oil. The above combined ingredients are generally referred to as "photopolymer."

In photopolymer compositions such as those described herein in which the photoacid generators include, for example, iodonium salts comprising a tetrakis (pentafluorophenyl) borate anion, e.g., cumyltolyliodonium tetrakis (pentafluorophenyl) borate and/or bis (methylphenyl)iodonium tetrakis (pentafluorophenyl) borate, optical absorption can be increased after recording a format hologram by exposure to UV light. Those skilled in the art are readily capable of determining the exposure required to achieve a desired absorption of light in such systems.

The following is a specific example of a photopolymer medium used with the present invention. PC-1000™ and PC-1004™ monomers from Polyset Corp. are dried prior to use by passage through activated silica (high purity grade, 70–230 mesh) which has been heated for two days at 155 degrees C. under dry atmosphere. Dow 705™ binder is purchased through Kurt J. Lesker Company and is dried for 24 hr at 155 degrees C. under vacuum prior to use. Cumyltolyliodonium tetrakis(pentafluorophenyl)borate from Rhodia Inc. is used as received, and 5,12 bis(phenylethynyl)naphthacene from Aldrich Chemical Co. is used as received.

In one embodiment, the photopolymer is made using 3–10% (w/w) of cumyltlolyliodonium tetrakis (pentafluorophenyl)borate photoacid generator, 0.002 0.06% (w/w) of 5,12-bis(phenyl-ethynyl)naphthacene sensitizer, 40–75% (w/w) of PC 1000™/PC-1004™ (difunctional/tetrafunctional) monomer mix, and 20–60% (w/w) of Dow Corning 705™. The monomer mix generally includes both PC1000™ and PC 1004™, and the weight percent of PC-1000™/PC-1004™ (difunctional monomer/tetrafunctional monomer) within the monomer mix can be varied substantially. Photopolymer having a monomer component of pure PC-1000™ as described in this example have been found to be effective. The preferred PC-1000™/PC-1004™ ratio of the monomer mix is between about 40/60 and 60/40 percent by weight, and most preferably about 50/50 percent by weight. The above ingredients of the photopolymer may be varied within the above weight percent ranges as required for particular uses and properties, such as optical media thickness, substrate composition, laser wavelength, shelf life, gratinng formation sensitivity, dynamic range, shrinkage, and angular selectivity, as is well known in the art. The above specific photopolymer is merely exemplary, and should not be considered limiting. Various other photopolymers may be used with the invention, and are considered to be within the scope of this disclosure.

The photopolymer is placed between glass slides, plates or sheets which are separated by a desired thickness to provide a photopolymer layer for optical data storage. The glass plates are mechanically held apart at a 120 micron separation and then retained at that separation and held in place by a UV curable adhesive. The photopolymer is placed between the 120 micron-separated sheets to form a photopolymer layer. The glass sheets may alternatively be held apart by PTFE or polyethylene spacers of desired thickness.

The photopolymer layer as described above preferably is thermally precured at a temperature of about 75 degrees Celsius for about 10 hours. This precure provides for an initial degree of polymerization of about 30 percent and helps avoid unwanted shrinkage in subsequent format hologram recording and data writing steps. Other temperature and time period combinations may also be used that allow for an initial polymerization of about 30 percent.

In one embodiment, a format hologram grating is then recorded in the photopolymer layer using a pair of light beams with a wavelength of 532 nanometers incident on opposite sides of the optical storage device. The reflection grating spacing can be tuned for a desired data retrieval wavelength by adjusting the angles of the hologram recording beams. To use data retrieval wavelengths substantially longer than the wavelength of the recording beam, right angle prisms can be used to achieve high angles of incidence at the storage device, as is well known to those skilled in the art. Preferably, the recorded reflection grating spacing is about 1.03 λ/2n, where λ is the desired data retrieval wavelength and n is a refractive index of the medium. When the reflection grating spacing is about 3% larger than λ/2n, efficient resolution is achieved for bit detection using retrieval beams having a numerical aperture of about 0.4 to 0.65. Preferably, the diffraction efficiency of the format grating on the order of 20 to 50 percent, and the exposure energy may be in the range of about 40 to 100 mJoules/cm².

Preferably, the resulting photopolymer hologram is then fixed to render the photopolymer insensitive to further holographic exposure at the wavelength used to record the format hologram. Fixing can be accomplished by exposure to white light or exposure to the same wavelength light used to record the format hologram. If photochromic or thermochromic media are used, the absorption may be subsequently changed by appropriate illumination or heating, respectively.

Additional methods for format hologram recording are described in copending U.S. patent application Ser. No. 09/016,382, "Optical Storage by Selective Localized Alteration of a Format Hologram and/or Retrieval by Selective Alteration of a Holographic Storage Medium" to Hesselink et al., filed Jan. 30, 1998. The configuration of the format hologram may vary as required for particular uses of the invention, to provide different formats for subsequent data writing. A variety of complex format hologram grating structures, including tube, layer and cylindrical shell hologram grating structures, are described in co-pending U.S. patent application Ser. No. 09/229,457, filed on Jan. 12, 1999, to Daiber et al.

It should be emphasized that the present invention does not store data holographically in the conventional manner by simply recording a hologram containing digital data. In particular, the format hologram does not itself represent recorded data. Instead, data are stored bit-by-bit at discrete physical locations within the bulk recording medium by altering the format hologram during writing. Thus, the present invention is distinguished from conventional page-based holographic volume storage. Strictly speaking, in a presently preferred embodiment of the present invention, holography is used to format the bulk recording material only, and writing data to the bulk recording medium is performed using essentially non-holographic techniques. The present invention is not limited, therefore, to data storage on a bulk recording medium containing a format hologram. The present invention can be employed on a recording medium that has a spatially-modulated refractive index that can be altered locally with a write pulse. Therefore it is conceivable and within the scope of the invention to implement any other material with these properties, regardless of whether or not the material was produced by holographic means. Other, non-holographic methods for creating a bulk recording medium with a spatially-modulated refractive index could also be used.

Figure 2A:
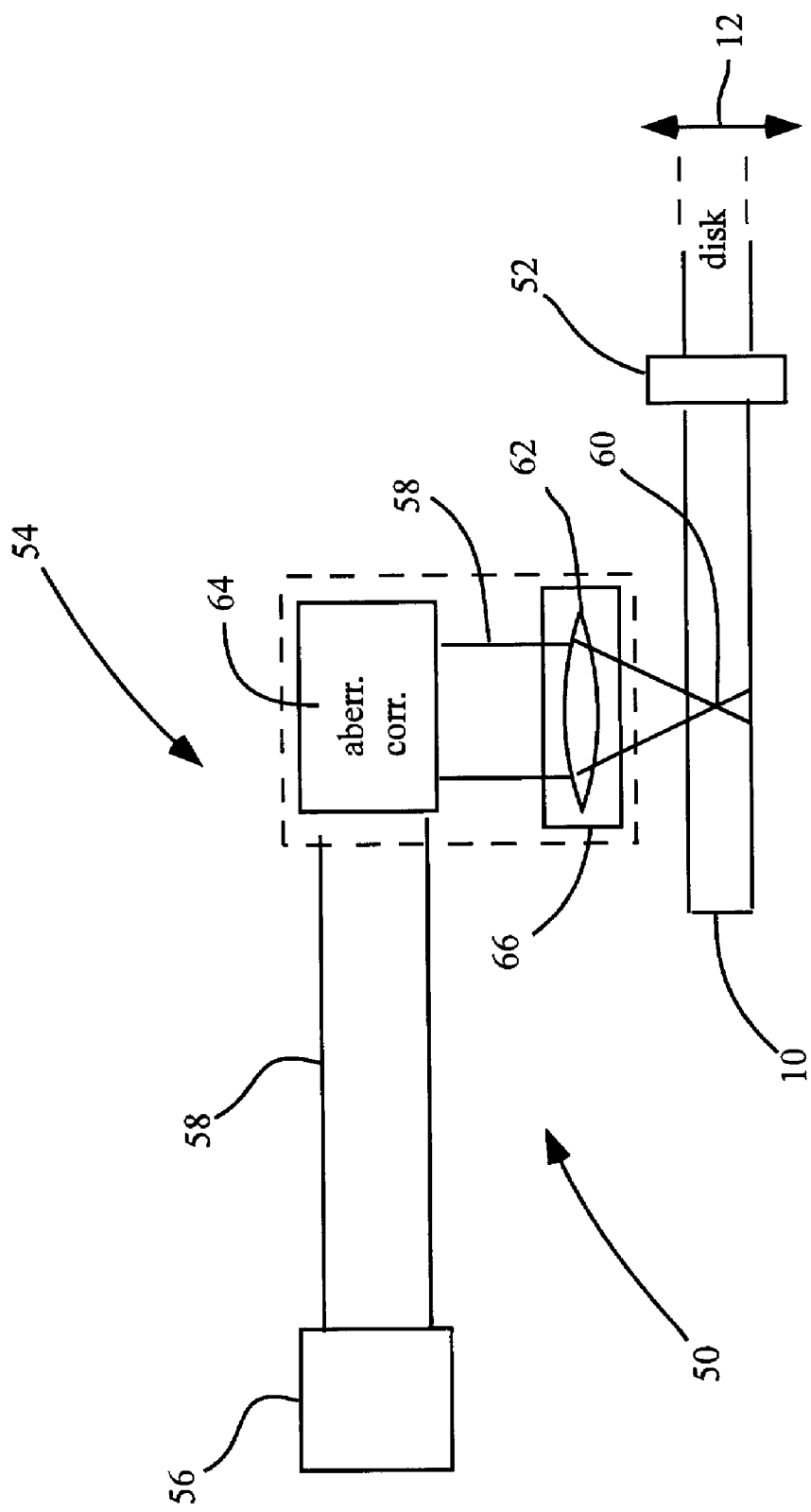
FIG. 2A is a schematic drawing of an optical data recording system in accordance with a preferred embodiment of the present invention.

A schematic drawing of a presently-preferred optical data recording system 50 is shown in FIG. 2A. The bulk recording medium 10 is disk-shaped and mounted on a rotary platform 52. The platform 52 continuously rotates the medium 10 under a recording head 54 at a high angular velocity about an axis parallel with the depth axis 12. Light source 56 generates a write beam 58, which can be focused at desired storage locations 60 within the bulk recording medium 10 using tunable optics housed within the recording head 54. To access a substantial range of depths, spherical aberration correction is used, e.g., for high area density per data layer. The optics of the recording head 54 may optionally include a high numerical aperture objective lens 62 and a dynamic aberration compensator 64. Objective lens 62 generally has a numerical aperture in the range of, e.g., around 0.4 to 0.5 or higher. Higher numerical apertures translate into shorter depths of field and smaller spot sizes at the beam focus, which, in turn, translate into greater recording density. The objective lens 62 is mounted on a multiple-axis actuator 66, such as a voice-coil motor, which controls the focusing and fine-tracking of the objective lens 62 relative to the medium 10.

When focused at a depth within the bulk recording medium 10, the write beam 58 will typically experience some spherical aberration as it focuses to a location inside bulk recording medium 10 of an index of refraction substantially different than the ambient index, such as air. The degree of these aberration effects will depend on the numerical aperture of write beam 58 and depth accessed by write beam 58. Spherical aberration causes undesirable blurring of write beam 58 at its focus, but it can be corrected using an aberration compensator 64. Any appropriate aberration compensator may be used and a description of the aberration compensator is omitted from this disclosure in order to avoid overcomplicating the disclosure. See, for example, U.S. patent application, Ser. No. 09/109,111 filed on Jul. 2, 1998, in the name of inventors Mark E. McDonald and Yu Chuan Lee, assigned to the assignee of the present invention, entitled "Spherical Aberration Correction Using Flying Lens and Method," for a disclosure of one appropriate aberration compensator. See also U.S. Pat. No. 5,202,875, issued Apr. 13, 1993, to Rosen et al. and entitled "Multiple Date Surface Optical Data Storage System," and U.S. Pat. No. 5,157,555, issued Oct. 20, 1992, to Reno and entitled, "Apparatus for Adjustable Correction of Spherical Aberration," which discloses another suitable aberation compensator.

Figure 3:
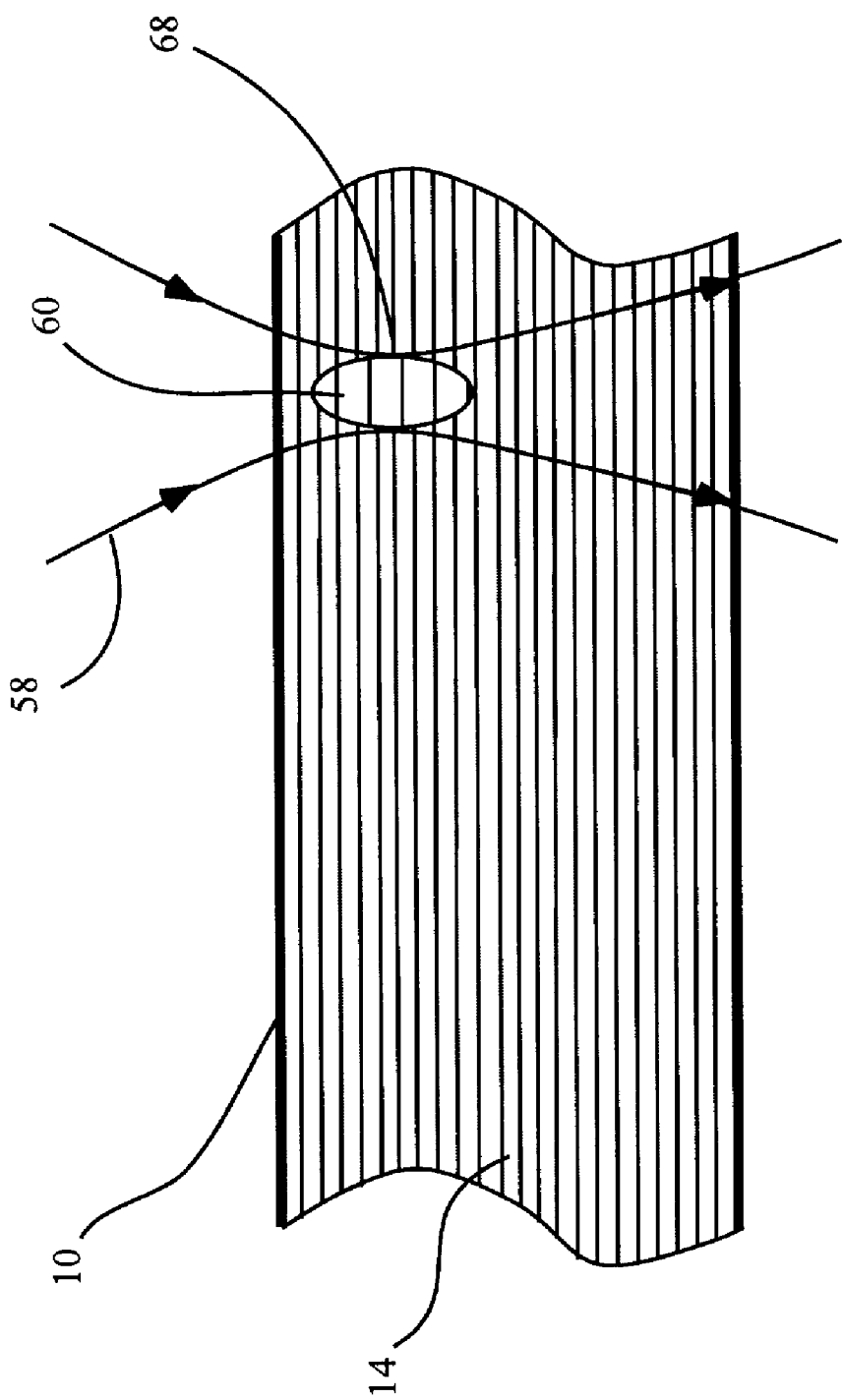
FIG. 3 is a schematic drawing of a method for writing data onto a storage location within a bulk recording medium, according to a presently preferred embodiment of the present invention.

The writing procedure is illustrated schematically in FIG. 3. In order to record a bit of data, the write beam 58 of FIG. 2A is focused at one of a plurality of selectable storage locations 60 within the bulk recording medium 10. In general, there is no requirement that write beam 58 have the same frequency as a retrieval beam used later to read the data. As will be apparent to those of ordinary skill in the art, the storage locations 60 can be arranged in a variety of ways throughout the volume of bulk recording medium 10. They may be arranged, for example, in a 3-dimensional lattice, rectangular or otherwise, so that data can be stored on multiple layers at various depths within the bulk recording medium 10.

The write beam 58 causes local heating of the bulk recording medium 10, which creates a local alteration 68 at selected storage location 60. Local alteration 68 may be a local expansion or contraction of the medium 10, which locally alters the format hologram in medium 10. If the local heating is substantial, the distortion is inelastic, and the local alteration 68 remains after the write beam 58 is switched off. Preferably, other portions of the medium, away from the local alteration, and through which the write beam passes, remain substantially unaffected. The local expansion or contraction alters the spacing of the Bragg fringes 14 of the format hologram and can result in a change of the mean index of refraction. Generally, a small expansion of the material, for example, results in a lower density, and therefore a decrease in the mean index of refraction. Changes in the mean index of refraction may also arise due to chemical and structural changes in the material. Therefore, although the "optical fringe spacing" parameter nd can increase due to material expansion it can also decrease due to a decrease in the index of refraction. If the "optical fringe spacing" parameter nd is altered, then a second Bragg reflection condition is defined, local to alteration 68, and distinct from the first Bragg reflection condition of the unaltered bulk recording medium 10. In particular, alteration 68 will have reflectivity properties that are different from those of the unaltered bulk recording medium 10.

Figure 2B:
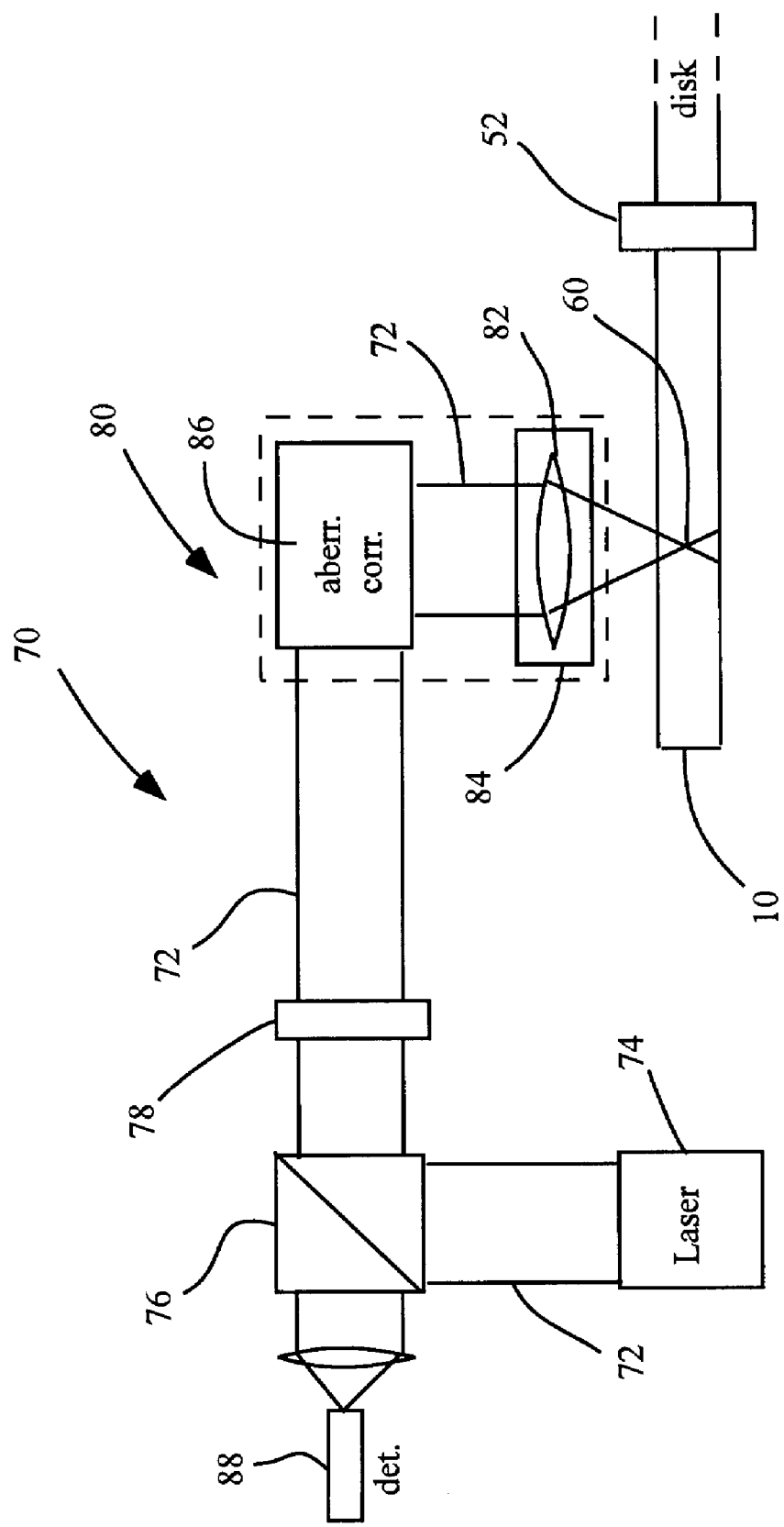
FIG. 2B is a schematic drawing of an optical data retrieval system in accordance with a preferred embodiment of the present invention.

Because the condition for Bragg reflection from the local alterations 68 is distinct from that of the bulk recording medium 10, the alterations 68 can be detected as variations in the reflectivity of the storage locations 60, using an optical data retrieval system such as the one shown schematically in FIG. 2B.

In accordance with the data retrieval system 70 of FIG. 2B, a retrieval beam 72 is produced by a light source 74 and passed through a polarizing beam-splitter 76 and a quarter-wave plate 78. Polarizing beam-splitters and quarter-wave plates are preferably used instead of simple beam-splitters for reducing losses at the separation elements and to suppress feedback to the laser. As with the write beam 58, the retrieval beam 72 is focused with a retrieval head 80 including a high numerical aperture lens 82 mounted on a multiple-axis servo-motor 84 and an aberration compensator 86.

Light reflected from the bulk recording medium 10 is measured with detector 88. In a presently-preferred embodiment of the invention, detector 88 is a confocal, depth-selective detector that includes spatial filtering optics that permit it to detect light Bragg-reflected from only those storage locations 60 at desired depths within the medium 10. Spatial filtering optics are well-known to those of ordinary skill in the art.

Figure 2C:
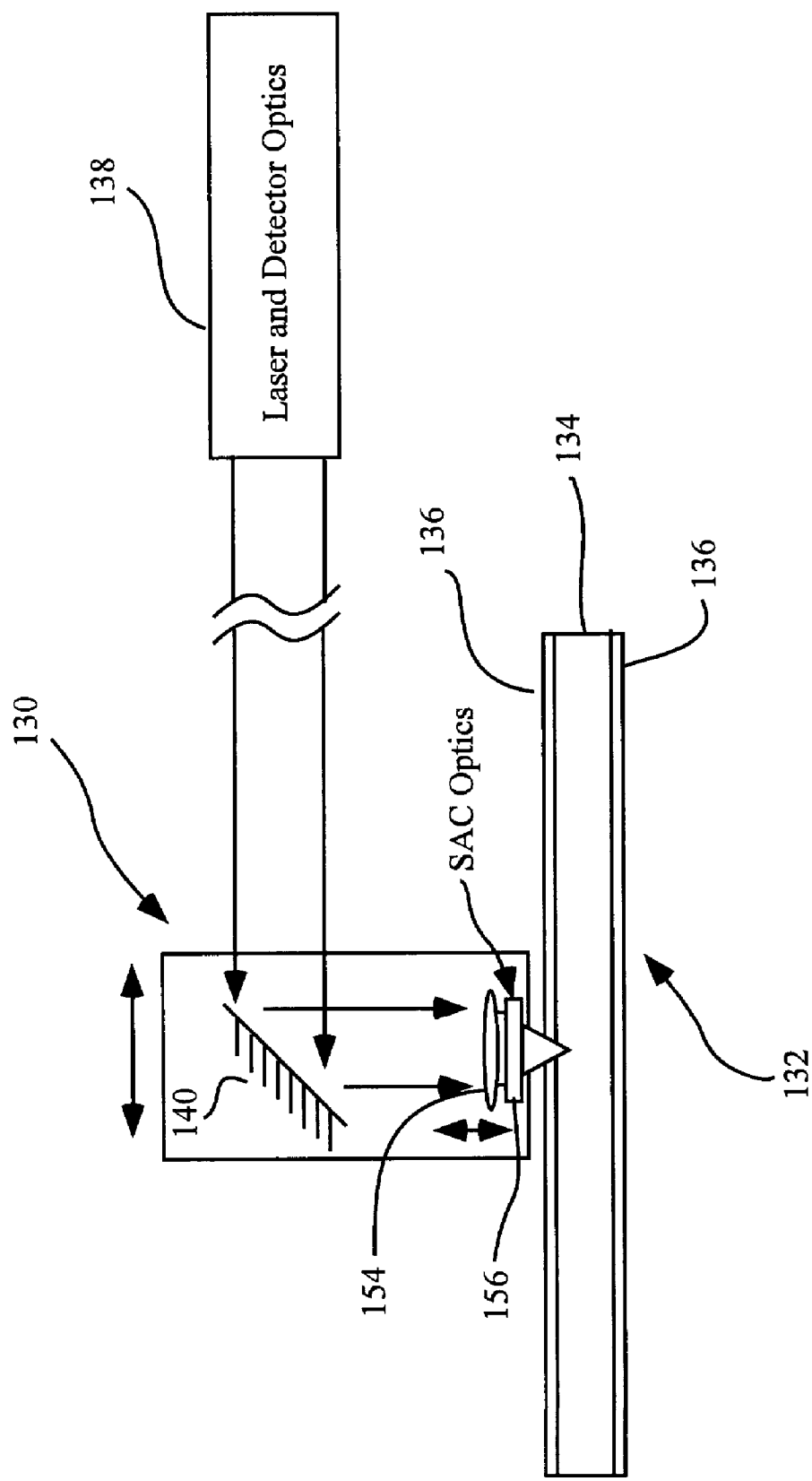
FIG. 2C is a schematic drawing of an optical data recording and/or retrieval system in accordance with another preferred embodiment of the present invention.

Referring to FIG. 2C, there is shown an embodiment of the present invention in which an optical head 130 is positioned to access a storage device 132 comprising a photopolymer 134, which further comprises a format hologram. The photopolymer medium 134 may be generally disposed between two cover layers 136 (e.g. glass) for stability and protection from the environment. Optical head 130 is used for both readin from and writing, to the medium 134. The output of optical head 130 is optically coupled to laser and detector optics 138 using reflecting surface 140. An objective lens 154 in optical head 330 focuses the access beam onto the medium. A dynamic spherical aberration corrector (SAC) 156 is optionally present in the path of the beam to correct for variations in spherical aberration that arise as different depths are accessed in the medium 134. Depending on the type of spherical aberration corrector used, it may be located before or after the objective lens 154.

Figure 2D:
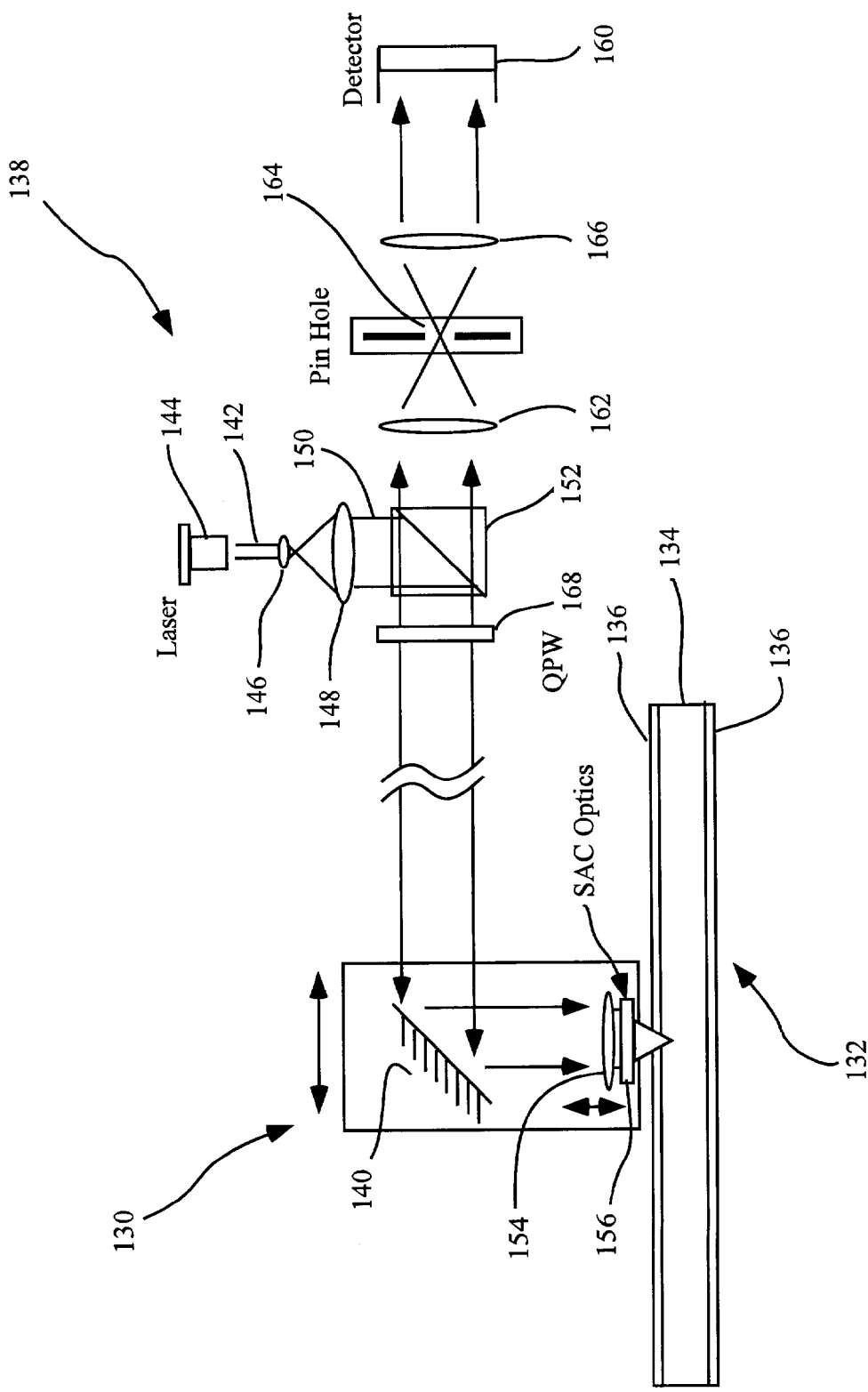
FIG. 2D is a schematic drawing of an optical recording and/or retrieval system in accordance with yet another preferred embodiment of the present invention.

Referring next to FIG. 2D, there is shown another embodiment of the present invention, with like reference numbers denoting like parts, in which laser and detector optics 138 include a confocal detector to discriminate light reflected from a desired layer. Laser illumination 142 from laser 144 for the access beam is expanded and directed toward the medium 134 by lenses 146 and 148. The expanded beam 150 passes through a beam splitter 152, which is present to couple the incident beam into the access path. The output of optical head 130 is optically coupled to laser 144 and detector optics 138 using reflecting surface 140. The objective lens 154 in optical head 130 focuses the access beam onto the medium. A dynamic spherical aberration corrector (SAC) 156 is optionally present in the path of the beam to correct for variations in spherical aberration that arise as different depths are accessed in the medium 134. Depending on the type of spherical aberration corrector used, it may be located before or after the objective lens 154. Light is focussed with a numerical aperture in the range of, e.g., 0.4 to 0.65 or higher. Thus, for visible wavelengths, spot sizes used to access data are on the order of about 1 mm or smaller.

Light is reflected from the accessed point in the medium 134. Reflected light is returned through spherical aberration corrector 156 and the objective lens 154. Reflected light passes through the beam splitter 152 towards the detector 160. A first lens 162 focuses the light to a point of focus. A pinhole 164 is situated to admit the focused light corresponding to the accessed layer; a pinhole situated in this manner is a well-known basis for confocal detection. A second lens 166 collimates the light, which is then detected by detector 160. An optional quarter wave plate 168 inserted between a polarizing beam splitter and the material will cause substantially all of the returning light to be deflected to the detector 160. In the case of a rotatable media such as a disk, rotation brings different regions of the medium into the range accessible to the optical head. The head is adjusted to position the focussed beam radially to access different tracks in the radial direction and in depth to access different data layers, by use of well known positioning techniques.

Figure 4A:
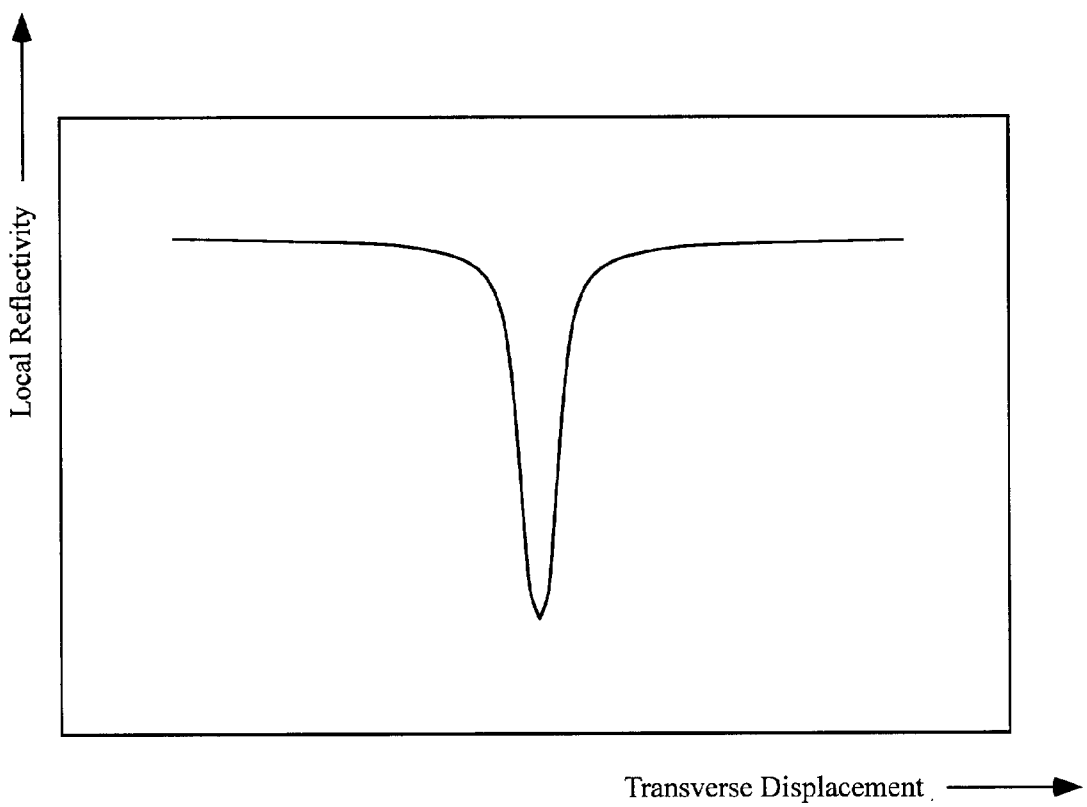
FIG. 4A is a plot showing reflectivity profile of a negative bit along a circumferential direction at a constant depth, in accordance with a preferred embodiment of the present invention.

Readout of the recorded information can be performed in at least two complementary ways. If the retrieval beam 72 is tuned to the Bragg reflection condition of the bulk recording medium 10, then the alterations 68 will reflect more light relative to the unaltered bulk recording medium 10. If the bulk recording medium 10 is spinning beneath the retrieval head 80, then the alteration 68 will appear to the detector 88 as a "negative bit," or a momentary drop in reflected intensity, as shown in FIG. 4A.

Figure 4B:
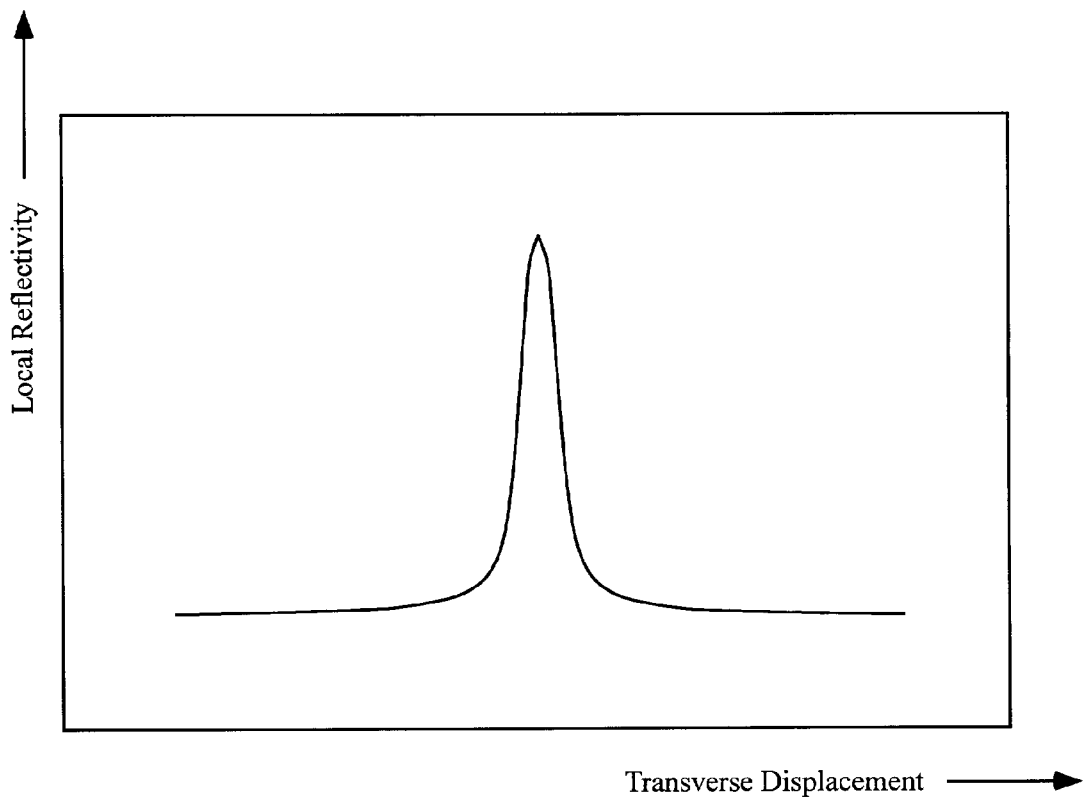
FIG. 4B is a plot showing reflectivity vs. in-plane coordinate indicating a positive bit in accordance with a preferred embodiment of the present invention.

It is possible to select the wavelength of the retrieval beam and the fringe spacing during the formatting step so that the retrieval beam 72 is tuned to a second Bragg reflection condition—that of the alterations 68. If this is done, then the alterations 68 will reflect more light relative to the unaltered bulk recording medium 10, and for a moving medium will register at the detector 68 as a "positive bit," or momentary increase in reflected intensity, as shown in FIG. 4B.

The latter, "positive bit" approach offers the advantage of detecting a positive pulse of light against a background of darkness, which may provide higher signal to noise ratios. However, the "negative bit" approach offers the advantage of tuning the retrieval beam to the bulk recording medium 10 rather than to the alterations 68, which would allow the use of complex format gratings.

Alternative Embodiments

Although illustrative presently preferred embodiments and applications of this invention are shown and described herein, many variations and modifications are possible which remain within the concept, scope, and spirit of the invention, and these variations would become clear to those of skill in the art after perusal of this application.

What is claimed is:

1. An optical data storage device comprising an optical data storage medium having a format hologram stored within, said format hologram having a periodic, spatially-modulated refractive index, said periodic, spatially-modulated refractive index defining a first Bragg-reflection condition, said optical data storage medium having data stored thereon as localized alterations of said optical data storage medium, said alterations defining a second Bragg-reflection condition.

2. The optical data storage device of claim 1, wherein said periodic, spatially-modulated refractive index varies along a single axis of said holographic storage medium only, said axis defining a depth axis of said holographic storage medium and a plurality of Bragg fringes perpendicular to said depth axis.

3. The optical storage device of claim 2, wherein said localized alterations are written at a plurality of depths of said optical data storage medium.

4. The optical storage device of claim 2, wherein said localized alterations are written at a single depth of said optical data storage medium.

5. The optical storage device of claim 1, wherein said localized alterations in said optical data storage medium are localized expansions of said holographic storage medium.

6. The optical storage device of claim 5, wherein said localized expansions of said optical data storage medium result in localized decreases in the index of refraction.

7. The optical storage device of claim 1, wherein said localized alterations in said optical data storage medium are localized contractions of said optical data storage medium.

8. The optical storage device of claim 7, wherein said localized contractions of said optical data storage medium result in localized increases in the index of refraction.

9. A method for optical data retrieval from an optical storage device, said optical storage device comprising an optical data storage medium having a periodic, spatially-modulated refractive index, said periodic, spatially-modulated refractive index defining a first Bragg-reflection condition, and data stored thereon as localized alterations of said optical data storage medium, said localized alterations defining a second Bragg-reflection condition, said method comprising the steps of:

choosing a frequency of a retrieval beam of electromagnetic radiation that is Bragg-matched to said first Bragg reflection condition;

focusing a retrieval beam at a plurality of localized storage points within said optical data storage medium to form an output beam; and detecting said output beam to retrieve said stored data.

10. A method for optical data retrieval from an optical storage device, said optical storage device comprising an optical data storage medium having a periodic, spatally-modulated refractive index, said periodic, spatially-modulated refractive index defining a first Bragg-reflection condition, and data stored thereon as localized alterations of said optical data storage medium said alterations defining a second Bragg-reflection condition, said method comprising the steps of:

choosing a frequency of a retrieval beam of electromagnetic radiation that is Bragg-matched to said second Bragg reflection condition;

focusing a retrieval beam at a plurality of localized storage points within said optical data storage medium to form an output beam; and detecting said output beam to retrieve said stored data.

11. An optical data storage system comprising:

an optical data storage medium, said medium having a periodic, spatially-modulated refractive index, said periodic, spatially-modulated refractive index defining a first Bragg-reflection condition;

a storage beam of electromagnetic radiation which causes a local alteration of said optical data storage medium when focused onto a localized region within said optical data storage medium, said local alteration defining a second Bragg-reflection condition; and optics means for focusing said storage beam at a plurality of localized storage points within said holographic storage medium.

12. The optical data storage system of claim 11 wherein said storage beam of electromagnetic radiation is of sufficient energy to cause a local alteration of said optical data storage medium.

13. The optical data storage system of claim 11 wherein said storage beam of electromagnetic radiation is of sufficient intensity to cause a local alteration of said optical data storage medium.

14. The optical data storage system of claim 11 wherein said storage beam of electromagnetic radiation is of sufficient duration to cause a local alteration of said optical data storage medium.

15. The optical data storage system of claim 11, wherein said local alterations in said optical data storage medium are inelastic local expansions of said optical data storage medium.

16. The optical data storage system of claim 15, wherein said inelastic local expansions of said optical data storage medium result in local decreases in the index of refraction.

17. The optical data storage system of claim 11, wherein said local alteration in said optical data storage medium are inelastic local contractions of said optical data storage medium.

18. The optical data storage system of claim 17, wherein said local contractions of said optical data storage medium result in local increases in the index of refraction.

19. The optical data storage system of claim 11, wherein said storage beam of electromagnetic radiation is a beam of laser light.

20. The optical data storage system of claim 11, wherein said periodic, spatially-modulated refractive index varies along a single axis of said optical data storage medium only, said axis defining a depth axis of said optical data storage medium and a plurality of Bragg fringes perpendicular to said depth axis.

21. The optical data storage system of claim 20, wherein said localized alterations are written at a plurality of depths within said optical data storage medium.

22. The optical data storage system of claim 20, wherein said optical data storage medium further comprises a format hologram stored within.

23. The optical data storage system of claim 22, wherein said format hologram is a reflection hologram.

24. A method for optical storage of data, said method comprising the steps of:
   creating an optical data storage medium having a periodic, spatially-modulated refractive index, said periodic, spatially-modulated refractive index defining a first Bragg reflection condition; and
   altering locally said optical data storage medium at a plurality of localized storage points within said optical data storage medium to result in localized alterations, said localized alterations defining a second Bragg reflection condition.

25. The method of claim 24, wherein said periodic, spatially-modulated refractive index varies along a single axis of said optical data storage medium only, said axis defining a depth axis of said optical data storage medium and a plurality of Bragg fringes perpendicular to said depth axis.

26. The method of claim 24, wherein said localized alterations are written at a plurality of depths within said optical data storage medium.

27. The method of claim 24, wherein said creating step further comprises the sub-step of writing a format hologram in said optical data storage medium.

28. The method of claim 27, wherein said format hologram is a reflection hologram.

29. The method of claim 25, wherein said altering locally step further comprises the steps of:
   focusing a storage beam of electromagnetic radiation at a plurality of localized storage points within said optical data storage medium; and
   heating said optical data storage medium to cause a localized inelastic expansion of said holographic storage medium.

30. The method of claim 29, wherein said storage beam of electromagnetic radiation is a beam of laser light.

31. An optical data retrieval system, said system comprising:
   an optical data storage device comprising:
      an optical data medium having a periodic, spatially-modulated refractive index, said periodic, spatially-modulated refractive index defining a first Bragg reflection condition; and
      data stored thereon as localized alterations of said optical data medium, said localized alterations defining a second Bragg reflection condition;
   a retrieval beam of electromagnetic radiation, having a frequency matched to said first Bragg reflection condition;
   optics for focusing said retrieval beam onto a plurality of localized storage points within said optical data storage device and forming an output beam; and
   an optical detector for detecting said output beam to retrieve said stored data.

32. The optical data retrieval system of claim 31, wherein said retrieval beam of electromagnetic radiation is a beam of laser light.

33. An optical data retrieval system, said system comprising:
   an optical data storage device comprising:
      an optical data storage medium having a periodic, spatially-modulated refractive index, said periodic, spatially-modulated refractive index defining a first Bragg reflection condition; and
      data stored thereon as localized alterations of said optical data storage medium, said localized alterations defining a second Bragg reflection condition;
   a retrieval beam of electromagnetic radiation, having a frequency matched to said second Bragg reflection condition;
   optics means for focusing said retrieval beam onto a plurality of localized storage points within said optical data storage device and forming an output beam; and
   an optical detector for detecting said output beam to retrieve said stored data.

34. The optical data retrieval system of claim 33, wherein said retrieval beam of electromagnetic radiation is a beam of laser light.

* * * * *